United States Patent
Shin et al.

(10) Patent No.: US 11,074,836 B2
(45) Date of Patent: Jul. 27, 2021

(54) DISPLAY APPARATUS

(71) Applicant: Samsung Display Co., Ltd., Yongin-Si (KR)

(72) Inventors: Jaiku Shin, Hwaseong-si (KR); Dongjin Park, Seongnam-si (KR); Hansun Ryou, Seoul (KR); Dongwoo Seo, Suwon-si (KR); Sung Chul Choi, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/742,137

(22) Filed: Jan. 14, 2020

(65) Prior Publication Data

US 2020/0273381 A1    Aug. 27, 2020

(30) Foreign Application Priority Data

Feb. 26, 2019 (KR) .................. KR10-2019-0022232

(51) Int. Cl.
*G06F 1/16*  (2006.01)
*G09F 9/30*  (2006.01)

(52) U.S. Cl.
CPC ............ *G09F 9/301* (2013.01); *G06F 1/1616* (2013.01); *G06F 1/1656* (2013.01)

(58) Field of Classification Search
CPC .... G06F 1/1616; G06F 1/1652; G06F 1/1656; G09F 9/301
See application file for complete search history.

(56) References Cited

U.S. PATENT DOCUMENTS

| | | | | |
|---|---|---|---|---|
| 9,348,450 | B1* | 5/2016 | Kim | G06F 3/0412 |
| 9,829,924 | B2 | 11/2017 | Shin et al. | |
| 10,067,536 | B1* | 9/2018 | Watamura | G06F 1/1652 |
| 10,198,038 | B2 | 2/2019 | Jang et al. | |
| 10,362,696 | B2* | 7/2019 | Ahn | G06F 1/1681 |
| 10,678,299 | B2* | 6/2020 | Jung | G06F 1/1641 |
| 10,831,234 | B1* | 11/2020 | Watamura | H05K 5/03 |
| 10,831,241 | B1* | 11/2020 | Watamura | G06F 1/1683 |
| 2011/0063783 | A1* | 3/2011 | Shim | G06F 1/1681 |
| | | | | 361/679.01 |

(Continued)

FOREIGN PATENT DOCUMENTS

| | | |
|---|---|---|
| KR | 1020160029543 A | 3/2016 |
| KR | 1020170064453 A | 6/2017 |
| KR | 1020180017388 A | 2/2018 |

*Primary Examiner* — Anthony Q Edwards
(74) *Attorney, Agent, or Firm* — Cantor Colburn LLP

(57) ABSTRACT

A display apparatus includes a display module, a first supporting portion, a second supporting portion, and a reinforcing member. A folding region, a first non-folding region and a second non-folding region are defined in the display module, when viewed in a plan view. The display module displays an image. The folding region is foldable about an imaginary folding axis, and the first and second non-folding regions are adjacent to two opposite sides, respectively, of the folding region, respectively. The first supporting portion supports the first non-folding region. The second supporting portion supports the second non-folding region and is spaced apart from the first supporting portion. The reinforcing member is adhered to the first and second supporting portions. The reinforcing member includes an incision pattern, which overlaps the folding axis in the folding region.

20 Claims, 17 Drawing Sheets

(56) References Cited

U.S. PATENT DOCUMENTS

| | | | |
|---|---|---|---|
| 2013/0021762 A1* | 1/2013 | van Dijk | H05K 5/0226 |
| | | | 361/749 |
| 2014/0042293 A1* | 2/2014 | Mok | G06F 1/1652 |
| | | | 248/682 |
| 2016/0334836 A1* | 11/2016 | Hong | G06F 1/1686 |
| 2016/0378203 A1* | 12/2016 | Kim | G06F 1/1679 |
| | | | 345/156 |
| 2017/0061836 A1 | 3/2017 | Kim et al. | |
| 2017/0118853 A1* | 4/2017 | Lee | G09F 9/301 |
| 2018/0203487 A1* | 7/2018 | Kee | G06F 1/1616 |
| 2018/0343756 A1* | 11/2018 | Lin | B32B 3/26 |
| 2019/0200466 A1* | 6/2019 | Kim | G06F 1/1652 |

* cited by examiner

DISPLAY APPARATUS

This US application claims priority to Korean Patent Application No. 10-2019-0022232, filed on Feb. 26, 2019, and all the benefits accruing therefrom under 35 U.S.C. § 119, the content of which in its entirety is herein incorporated by reference.

BACKGROUND

1. Field

The disclosure relates to a display apparatus, and in particular, to a display apparatus with improved durability and display quality.

2. Description of the Related Art

A display apparatus displays various images on a display screen thereof and provides information to a user. Recently, a foldable or rollable display apparatus with a bendable or flexible display member is being developed. A flexible display apparatus, unlike a flat rigid panel display apparatus, may be folded or rolled, like a piece of paper. Since the shape of the flexible display apparatus may be variously changed, the flexible display apparatus is used to improve portability and user convenience.

SUMMARY

A foldable display apparatus may be folded about a folding axis. A folding region of the foldable display apparatus may be deformed by a stress, and in this case, a user may recognize such a deformed region as a defect.

An embodiment of the invention provides a display apparatus with improved durability and display quality.

According to an embodiment of the invention, a display apparatus includes a display module, a first supporting portion, a second supporting portion, and a reinforcing member.

In such an embodiment, a folding region, a first non-folding region and a second non-folding region are defined in the display module, when viewed in a plan view.

In such an embodiment, the display module may display an image, the folding region is foldable about an imaginary folding axis, and the first and second non-folding regions re adjacent to two opposite sides of the folding region, respectively.

In such an embodiment, the first supporting portion supports the first non-folding region.

In such an embodiment, the second supporting portion is spaced apart from the first supporting portion and supports the second non-folding region.

In such an embodiment, the reinforcing member is adhered to the first and second supporting portions, and the reinforcing member includes an incision pattern, which overlaps the folding axis in the folding region.

In an embodiment, when the display module is in an unfolded state, the folding region may be disposed between the first non-folding region and the second non-folding region in a first direction, and the folding axis may extend in a second direction crossing the first direction.

In an embodiment, the incision pattern may include a first sub-incision pattern and a second sub-incision pattern. In such an embodiment, the first sub-incision pattern may extend in the second direction and may overlap the folding axis, and the second sub-incision pattern may be connected to the first sub-incision pattern and may extend in the first direction.

In an embodiment, the second sub-incision pattern may have a length greater than a length of the folding region in the first direction.

In an embodiment, the second sub-incision pattern may not overlap the first and second supporting portions. Alternatively, at least a portion of the second sub-incision pattern may overlap the first and second supporting portions.

In an embodiment, the reinforcing member may include an inner reinforcing member disposed inside the second sub-incision pattern in the second direction, and an outer reinforcing member disposed outside the second sub-incision pattern in the second direction. In such an embodiment, the outer reinforcing member may not overlap the first and second supporting portions, when viewed in the plan view.

In an embodiment, the reinforcing member may be coupled to a bottom surface of the first supporting portion and a bottom surface of the second supporting portion.

In an embodiment, the reinforcing member may include a first reinforcing member and a second reinforcing member. In such an embodiment, the first reinforcing member may be connected to a side of the first supporting portion and a side of the second supporting portion, and the second reinforcing member may be spaced apart from the first reinforcing member and may be connected to an opposite side of the first supporting portion and an opposite side of the second supporting portion.

In an embodiment, the reinforcing member may be formed as single unitary and indivisible unit.

In an embodiment, when the display module is in an unfolded state, the folding region may be disposed between the first non-folding region and the second non-folding region in a first direction and the folding axis may be extended in a second direction crossing the first direction.

In such an embodiment, the incision pattern may include a first sub-incision pattern, a second sub-incision pattern, and a third sub-incision pattern.

In such an embodiment, the first sub-incision pattern may extend in the second direction and may overlap the folding axis.

In such an embodiment, the second sub-incision pattern may be connected to an end of the first sub-incision pattern and may extend in the second direction.

In such an embodiment, the third sub-incision pattern may be connected to an opposite end of the first sub-incision pattern and may extend in the second direction.

In an embodiment, each of the second sub-incision pattern and the third sub-incision pattern may have a length greater than a length of the folding region, in the first direction.

In an embodiment, each of the second and third sub-incision patterns may not overlap the first and second supporting portions. Alternatively, at least a portion of each of the second and third sub-incision patterns may overlap the first and second supporting portions.

In an embodiment, the reinforcing member may be coupled to a top surface of the first supporting portion and a top surface of the second supporting portion.

In an embodiment, each of the first and second supporting portions may have a rigidity higher than a rigidity of the display module.

In an embodiment, the folding region of the display module may be inwardly folded such that two portions of a display surface displaying the image face each other.

In an embodiment, the display apparatus may further include an adhesive member and a non-adhesive member, which is disposed between the display module and the first sup. In such an embodiment, the adhesive member may be disposed between the display module and the first supporting portion and between the display module and the second supporting portion, and the non-adhesive member may be disposed between the display module and the first supporting portion and between the display module and the second supporting portion in the folding region. In such an embodiment, the non-adhesive member may be in contact with the adhesive member.

According to an embodiment of the invention, a display apparatus includes a display module, a first supporting portion, a second supporting portion, and a reinforcing member. In such an embodiment, a folding region, a first non-folding region and a second non-folding region are defined in the display module, when viewed in a plan view. In such an embodiment, the display module displays an image, and the folding region is foldable about an imaginary folding axis, and the first and second non-folding regions are adjacent to two opposite sides of the folding region in a first direction, respectively.

In such an embodiment, the first supporting portion supports the first non-folding region.

In such an embodiment, the second supporting portion is spaced apart from the first supporting portion and supports the second non-folding region.

In such an embodiment, the reinforcing member is adhered to the first and second supporting portions, and the reinforcing member may include a sub-incision pattern, which has a width larger than a width of the folding region in the first direction.

In an embodiment, the sub-incision pattern may not overlap the first and second supporting portions. Alternatively, at least a portion of the sub-incision pattern may overlap the first and second supporting portions.

In an embodiment, the folding axis may extend in a second direction crossing the first direction. In such an embodiment, the reinforcing member may include an inner reinforcing member disposed inside the sub-incision pattern in the second direction, and an outer reinforcing member disposed outside the sub-incision pattern in the second direction. In such an embodiment, the outer reinforcing member may not overlap the first and second supporting portions, when viewed in a plan view.

In an embodiment, the reinforcing member may include a synthetic resin or a metallic material.

According to an embodiment of the invention, a display apparatus includes a display module, a first supporting portion, a second supporting portion, an adhesive member, a non-adhesive member, and a reinforcing member.

In such an embodiment, a folding region, a first non-folding region and a second non-folding region are defined in the display module, when viewed in a plan view. In such an embodiment, the display module may display an image, the folding region is foldable about an imaginary folding axis, and the first and second non-folding regions are adjacent to two opposite sides of the folding region in a first direction, respectively.

In such an embodiment, the first supporting portion supports the first non-folding region.

In such an embodiment, the second supporting portion is spaced apart from the first supporting portion and supports the second non-folding region.

In such an embodiment, the adhesive member is disposed between the display module and the first supporting portion and between the display module and the second supporting portion.

In such an embodiment, the non-adhesive member is disposed between the display module and the first supporting portion and between the display module and the second supporting portion in the folding region. In such an embodiment, the non-adhesive member is in contact with the adhesive member.

In such an embodiment, the reinforcing member is adhered to the first and second supporting portions and includes a first sub-incision pattern, which overlaps the folding axis in the folding region, and a second sub-incision pattern, which is connected to an end of the first sub-incision pattern and has a width greater than a width of the folding region in the first direction.

BRIEF DESCRIPTION OF THE DRAWINGS

The above and other features of the invention will become apparent by describing in detail exemplary embodiments thereof with reference to the accompanying drawings, in which.

DETAILED DESCRIPTION

Figure 1:
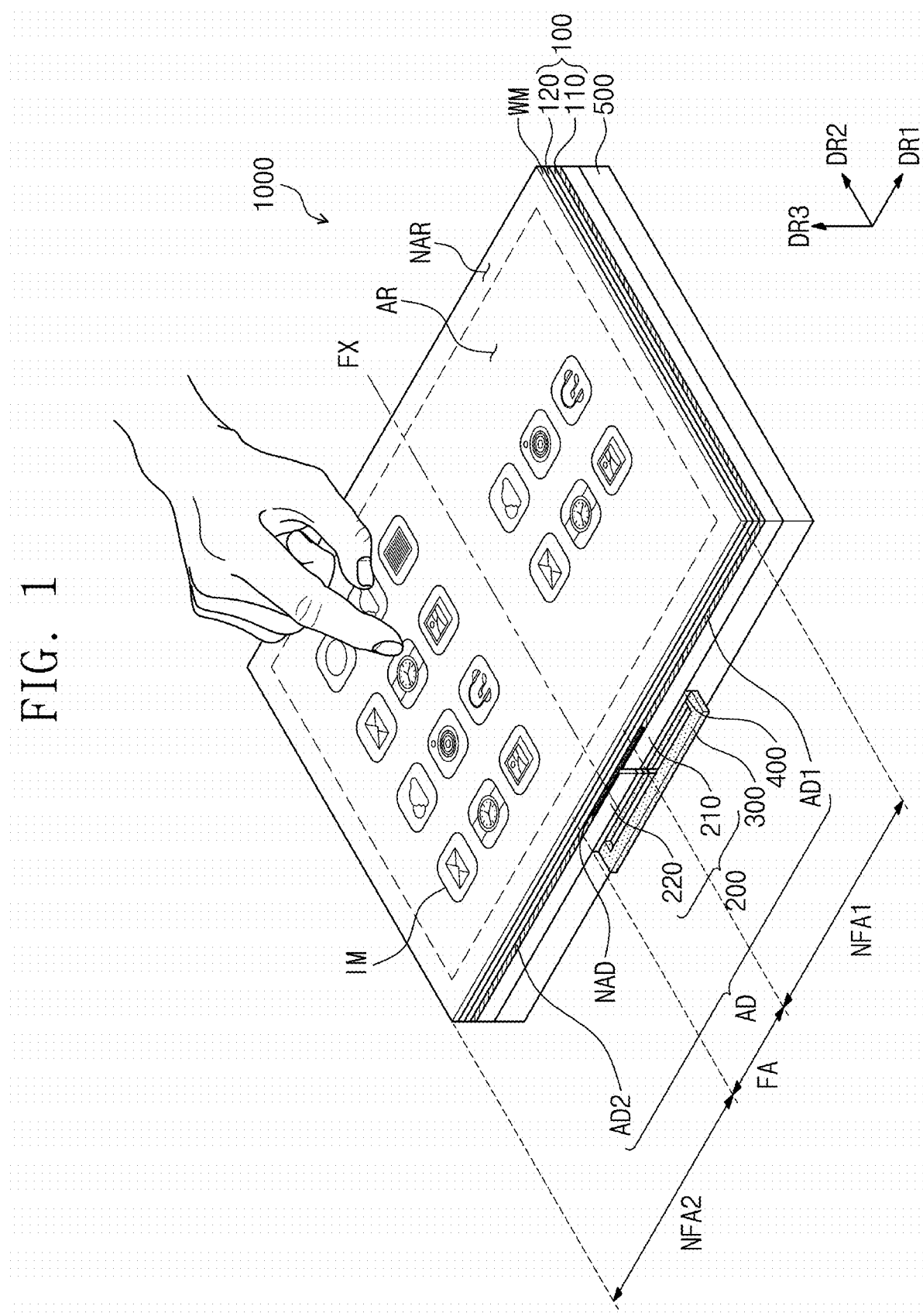
FIG. 1 is a perspective view illustrating a display apparatus according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. "At least one of A and B" means "A or B." "Or" means "and/or." As used herein, the term "and/or" includes any and all combinations of one or more of the associated listed items. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Exemplary embodiments of the inventions are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, exemplary embodiments of the inventions should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments of the inventions belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, embodiments of the invention will be described in detail with reference to the accompanying drawings.

Figure 2:
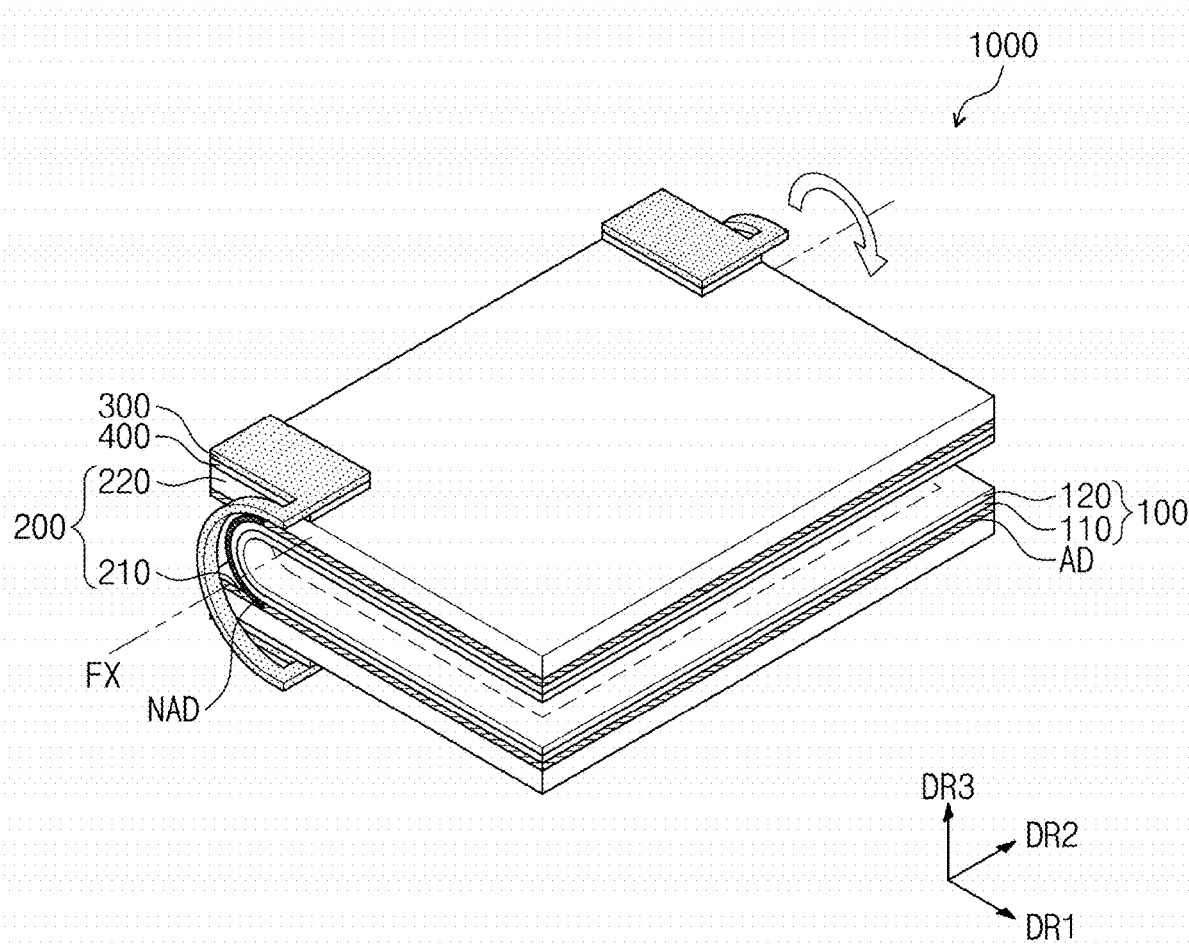
FIG. 2 is a perspective view illustrating the display apparatus of FIG. 1 In an inwardly folded state.
Figure 3:
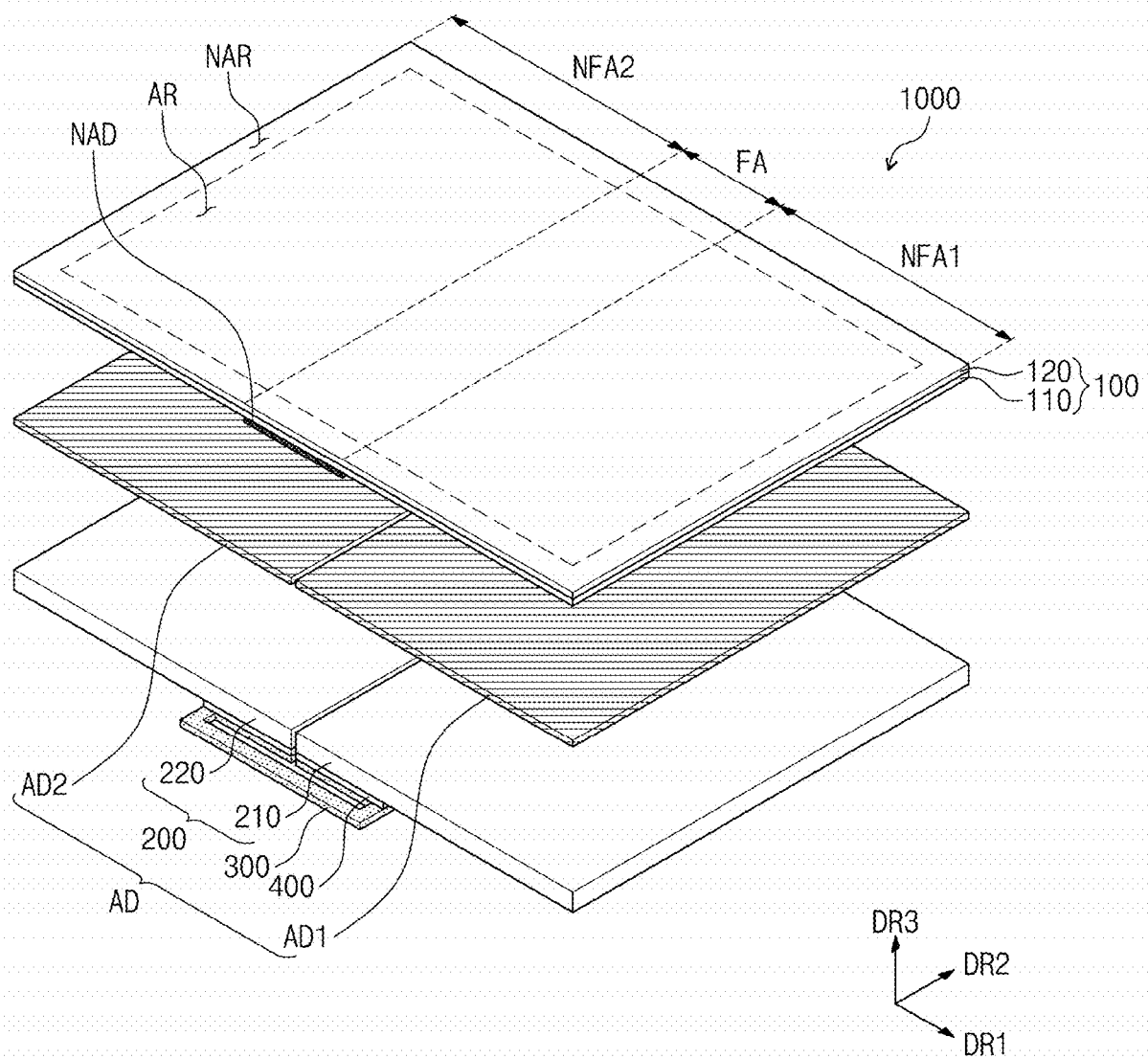
FIG. 3 is an exploded perspective view illustrating the display apparatus shown in FIG. 1.

FIG. 1 is a perspective view illustrating a display apparatus according to an embodiment of the invention, and FIG. 2 is a perspective view illustrating the display apparatus of FIG. 1 in an inwardly folded state. FIG. 3 is an exploded perspective view illustrating the display apparatus shown in FIG. 1.

Referring to FIGS. 1 and 2, an embodiment of a display apparatus 1000 according to the invention may have a rectangular shape with long sides parallel to a first direction DR1 and short sides parallel to a second direction DR2, where the first and second directions DR1 and DR2 are not parallel to each other. Here, a third direction DR3, which is perpendicular to the first and second directions DR1 and DR2, may be a thickness direction of the display apparatus 1000. However, the invention is not limited thereto, and in such embodiments, the shape of the display apparatus 1000 may be variously modified.

The display apparatus 1000 may be a flexible display apparatus. In one embodiment, for example, the display apparatus 1000 may be folded or unfolded along a folding axis FX extending in a predetermined direction. In such an embodiment, the display apparatus 1000 may be a foldable display device. In an embodiment, the folding axis FX may be parallel to the second direction DR2.

The display apparatus 1000 may be divided into a plurality of regions, according to its folding state. In one embodiment, for example, the display apparatus 1000 may be divided into a folding region FA and at least one non-folding region NFA1 and NFA2, when viewed in a plan view. Herein, "a plan view" may mean a plan view in the third direction DR3. The folding region FA may be a region, on which folding stress is exerted, when the display apparatus 1000 is folded. When viewed in a plan view, the folding region FA may overlap the folding axis FX.

In an embodiment, as shown in FIG. 1, the folding region FA of the display apparatus 1000 may be defined between two non-folding regions NFA1 and NFA2. The two non-folding regions NFA1 and NFA2 may be referred to as a first non-folding region NFA1 and a second non-folding region NFA2, respectively. The first non-folding region NFA1 may be adjacent to a side of the folding region FA in the first direction DR1, and the second non-folding region NFA2 may be adjacent to an opposite side of the folding region FA in the first direction DR1.

The folding region FA, the first non-folding region NFA1, and the second non-folding region NFA2 may be defined in each of members constituting the display apparatus 1000.

In an embodiment, as shown in FIG. 1, a single folding region FA may be defined in the display apparatus 1000, but the invention is not limited thereto. In an alternative embodiment, a plurality of folding regions may be defined in the display apparatus 1000.

In an embodiment, as shown in FIG. 2, the display apparatus 1000 may be folded in an in-folding manner. In such an embodiment, the display apparatus 1000 may be folded in a way such that two portions of a top surface, which is defined as a display surface for displaying an image IM, face each other. In such an in-folding state, the display surface of the display apparatus 1000 may be covered by a bottom surface, which is opposite to the display surface, and thus may not be exposed to an outside.

However, the invention is not limited thereto, and in an embodiment, the display apparatus may be folded in an out-folding manner in which the top surface of the display apparatus 1000 is exposed to an outside. For convenience of description, hereinafter, embodiments where the display apparatus 1000 is an in-folding type will be described in detail, and the technical features of the display apparatus 1000 to be described below may be applied to realize the display apparatus of an out-folding type.

Referring to FIGS. 1 to 3, an embodiment of the display apparatus 1000 may include a display module 100, a window member WM, a supporting member 200, an adhesive member AD, at least one non-adhesive member NAD, a reinforcing member 300, an adhesive reinforcing layer 400, and a frame 500.

The display module 100 may be divided into an active region AR and a peripheral region NAR, when viewed in a plan view. The active region AR may be defined to overlap a center region of the display module 100, when viewed in a plan view. The peripheral region NAR may be adjacent to the active region AR. The peripheral region NAR may enclose the active region AR. In the embodiment, the peripheral region NAR may be defined to have a frame shape enclosing the active region AR.

However, the invention is not limited to the shapes and the numbers of the active region AR and the peripheral region NAR. In one embodiment, for example, the display module 100 may include only the active region AR or may include a plurality of active regions spaced apart from each other.

The display module 100 may include a display panel 110 and an input sensing member 120.

The display panel 110 may display the image IM (e.g., see FIG. 1) on the active region AR. The input sensing member 120 may be disposed on the display panel 110 to sense a touch event on the active region AR.

The window member WM may provide or define a front surface (or an uppermost surface) of the display apparatus 1000. The window member WM may be disposed on the front surface of the display module 100 to protect the display module 100. In one embodiment, for example, the window member WM may include a glass substrate, a sapphire substrate, or a plastic film. The window member WM may have a single-layer structure or a multi-layer structure. In one embodiment, for example, the window member WM may have a stacking structure including a plurality of plastic films, which are coupled to each other by an adhesive layer, or may have a stacking structure including a glass substrate and a plastic film, which are coupled to each other by an adhesive layer.

For convenience of illustration, the window member WM shown in FIG. 1 may not be illustrated in the following drawings.

The supporting member 200 may be disposed below the display module 100 to support the display module 100. The supporting member 200 may have a plate shape. The supporting member 200 may have rigidity that is higher than that of the display module 100. In one embodiment, for example, the supporting member 200 may be formed of or include a metallic material. However, the invention is not limited to a specific material of the supporting member 200.

The supporting member 200 may include a first supporting portion 210 and a second supporting portion 220. The first supporting portion 210 may overlap a side portion of the display module 100 in the first direction DR1. The first supporting portion 210 may overlap a portion of the folding region FA and the first non-folding region NFA1 and may support the portion of the folding region FA and the first non-folding region NFA1. The second supporting portion 220 may overlap other side portion of the display module 100 in the first direction DR1. The second supporting portion 220 may overlap the remaining portion of the folding region FA and the second non-folding region NFA2 and may support the remaining portion of the folding region FA and the second non-folding region NFA2. The first supporting portion 210 and the second supporting portion 220 may be spaced apart from each other.

The adhesive member AD may be disposed between the display module 100 and the supporting member 200. The adhesive member AD may combine the display module 100 to the supporting member 200, in the non-folding regions NFA1 and NFA2.

The adhesive member AD may include a first adhesive member AD1 and a second adhesive member AD2. The first adhesive member AD1 and the second adhesive member AD2 may be spaced apart from each other in the first direction DR1. The first adhesive member AD1 may be disposed between the first supporting portion 210 and the first non-folding region NFA1. The second adhesive member AD2 may be disposed between the second supporting portion 220 and the second non-folding region NFA2.

The first and second adhesive members AD1 and AD2 may overlap the folding region FA. In the folding region FA, the first and second adhesive members AD1 and AD2 may be disposed between the first and second supporting portions 210 and 220 and the display module 100 and may be used to support the display module 100.

In an embodiment, the adhesive member AD may be formed of or include a thermosetting resin or a photocurable resin.

The non-adhesive member NAD may be disposed between the first and second adhesive members AD1 and AD2 and the display module 100. The non-adhesive member NAD may be coupled to a bottom surface of the display module 100. The non-adhesive member NAD may be in contact with the first and second adhesive members AD1 and AD2. The non-adhesive member NAD may reduce an adhesion strength between the adhesive member AD and the display module 100, in the folding region FA. In one embodiment, for example, the non-adhesive member NAD may include fluorine or titanium. The non-adhesive member NAD may be disposed to overlap the folding region FA.

In an embodiment, the reinforcing member 300 may be adhered or attached to the first supporting portion 210 and the second supporting portion 220. The reinforcing member 300 may not interfere with a path of the first supporting portion 210 and the second supporting portion 220 being spaced apart from a portion of the display module 100, when the display apparatus 1000 is folded. In such an embodiment, the reinforcing member 300 may reduce a shear stress to be exerted on the first supporting portion 210 and the second supporting portion 220 by an external impact. This will be described in greater detail below.

The adhesive reinforcing layer 400 may be disposed between the supporting member 200 and the reinforcing member 300 to combine the supporting member 200 and the reinforcing member 300 with each other.

The frame 500 may be disposed below the reinforcing member 300. Although not shown, the display apparatus 1000 may further include a back-side case disposed below the frame 500, and components (e.g., a battery, a main PCB, or the like) for operating the display apparatus 1000 may be disposed in a space between the frame 500 and the back-side case.

Figure 4:
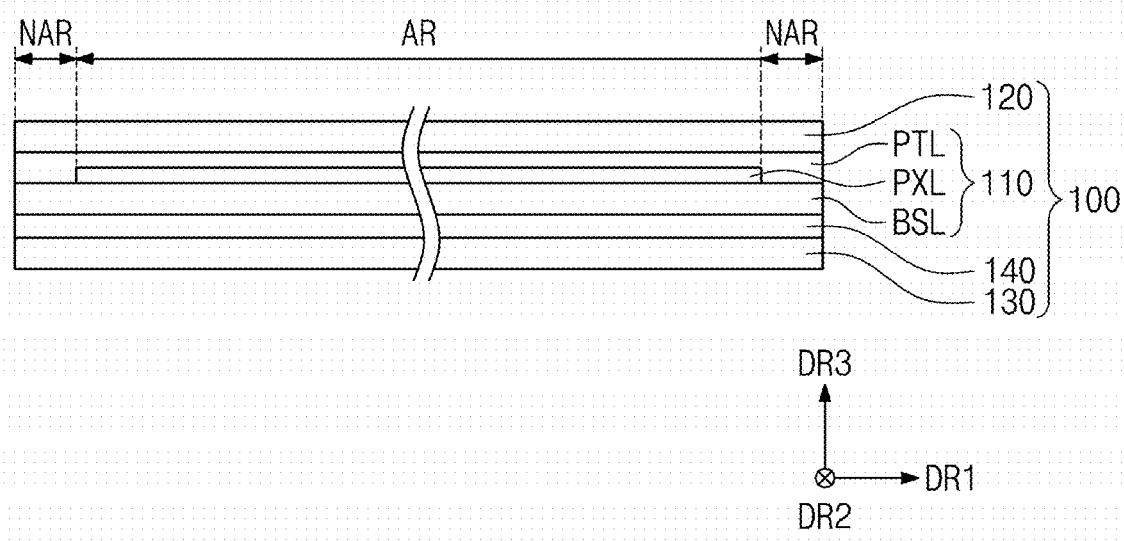
FIG. 4 is an enlarged sectional view illustrating a display module shown in FIGS. 1 to 3.

FIG. 4 is an enlarged sectional view illustrating the display module shown in FIGS. 1 to 3.

Referring to FIG. 4, an embodiment of the display panel 110 may include a base layer BSL, a pixel layer PXL, and a protection layer PTL. The base layer BSL may define a rear surface (or a lowermost surface) of the display module 100. The base layer BSL may be formed of or include a flexible material.

The pixel layer PXL may be disposed on the base layer BSL. The pixel layer PXL may include a plurality of pixels. In an embodiment, when an electrical signal is applied to each of the pixels, each of the pixels may emit light corresponding to the electrical signal.

In an embodiment, the kind of the display panel 110 may be determined depending on the structure of the pixel layer PXL. The display panel 110 may be one of a liquid crystal display panel, an organic light emitting display panel, an electrophoretic display panel, an electrowetting display pane, and various other display panels displaying an image. In such an embodiment, the display panel 110 may be realized in various types of display panel, and the invention is not limited to a specific type.

The display module 100 may further include a cushion layer 130 and an adhesive cushion layer 140.

The cushion layer 130 may be disposed below the display panel 110, and the adhesive cushion layer 140 may adhere the display panel 110 to the cushion layer 130.

The cushion layer 130 may absorb an impact that may be applied to a rear surface of the display panel 110 and may protect the display panel 110.

Figure 5:
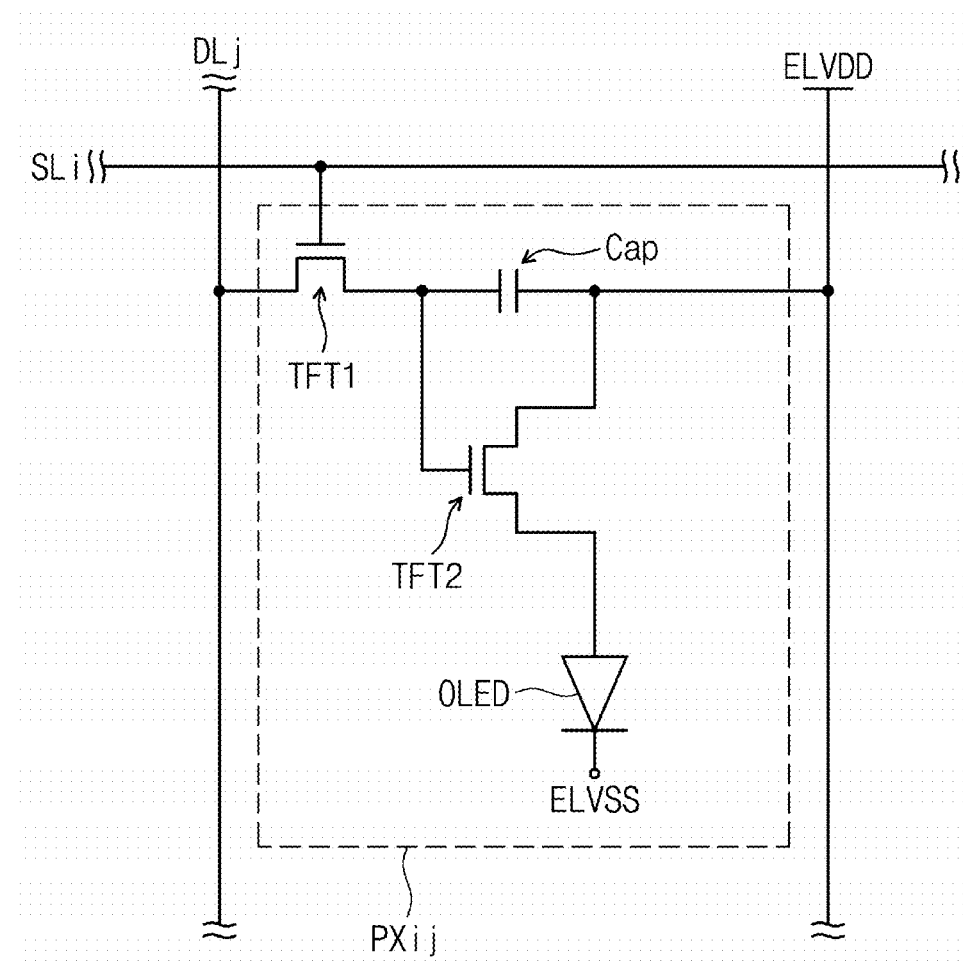
FIG. 5 is an equivalent circuit diagram of a pixel of a display apparatus.

FIG. 5 is an equivalent circuit diagram of a pixel of a display apparatus.

Referring to FIG. 5, an embodiment of the display panel 110 may be an organic light emitting display panel. In such an embodiment, a pixel PXij may include at least one thin film transistor, at least one capacitor, and at least one display element. In an embodiment, as shown in FIG. 5, the pixel PXij may include a first thin film transistor TFT1, a second thin film transistor TFT2, one capacitor Cap, and an organic light emitting device OLED.

The first thin film transistor TFT1 may include a control electrode connected to an i-th scan line SLi, an input electrode connected to a j-th data line DLj, and an output electrode. The first thin film transistor TFT1 may output a data signal, which is applied to the j-th data line DLj, in response to a scan signal applied to the i-th scan line SLi.

The capacitor Cap may include a first capacitor electrode connected to the first thin film transistor TFT1 and a second capacitor electrode receiving a first power voltage ELVDD. The capacitor Cap may store electric charges, and an amount of the charges stored in the capacitor Cap may be determined by a difference between a voltage corresponding to the data signal, which is transmitted through the first thin film transistor TFT1, and the first power voltage ELVDD.

The second thin film transistor TFT2 may include a control electrode, which is connected to the output electrode of the first thin film transistor TFT1 and the first capacitor electrode of the capacitor Cap, an input electrode, which receives the first power voltage ELVDD, and an output electrode. The output electrode of the second thin film transistor TFT2 may be connected to the organic light emitting device OLED.

The second thin film transistor TFT2 may control a driving current flowing through the organic light emitting device OLED, based on an amount of electric charges stored in the capacitor Cap. A turn-on time of the second thin film transistor TFT2 may be determined depending on the amount of charges stored in the capacitor Cap. A voltage, which is supplied to the organic light emitting device OLED through the output electrode of the second thin film transistor TFT2, may be substantially lower than the first power voltage ELVDD.

The organic light emitting device OLED may include a first electrode connected to the second thin film transistor TFT2 and a second electrode receiving a second power voltage ELVSS. The organic light emitting device OLED may include a light-emitting pattern disposed between the first electrode and the second electrode.

The organic light emitting device OLED may emit light, during the turn-on time of the second thin film transistor TFT2. Color (i.e., wavelength) of light emitted from the organic light emitting device OLED may be determined by a material of the light-emitting pattern. In one embodiment, for example, the color of light generated by the organic light emitting device OLED may be one of a red color, a green color, a blue color, and a white color.

The protection layer PTL may be disposed on the pixel layer PXL to cover the pixel layer PXL. The protection layer PTL may electrically separate or insulate the pixel layer PXL from the input sensing member 120.

In one embodiment, for example, the protection layer PTL may be an encapsulation layer encapsulating the pixel layer PXL. In an embodiment, the protection layer PTL may include a plurality of stacked organic and/or inorganic layers.

Alternatively, the protection layer PTL may be a planarization layer, which is disposed on the pixel layer PXL and has a flat top surface. The structure of the protection layer PTL may be variously modified, and the invention is not limited to a specific embodiment.

Referring back to FIG. 4, the input sensing member 120 may be disposed on the protection layer PTL. The active region AR of the input sensing member 120 may substantially overlap a region, on which the pixel layer PXL is disposed.

The input sensing member 120 may sense an external input provided on the active region AR of the display module 100.

The external input may be provided in various manners. FIG. 1 illustrates an embodiment, in which an external input provided by a user's body (e.g., a finger) is sensed by the input sensing member 120. However, the invention is not limited to a specific way of inputting the external input in the input sensing member 120. In one embodiment, for example, the external input may be input in one of optical, contact-sensitive or magnetic manners.

Although not shown, the input sensing member 120 may include an input sensing cell, driving lines, and pads. The input sensing cell may include a plurality of input sensing sensors to sense the external input, and the driving line and pads may be used to apply electrical signals to the input sensing cell or to transmit electrical signals, which are generated by the input sensing cell, to the outside. The pads may be connected to the display panel 110 or to an external power supply (not shown).

The input sensing member 120 may sense the external input in various manners. In one embodiment, for example, the input sensing member 120 may operate in a capacitive manner, a resistance layer manner, a coordinate recognition manner, or the like.

Figure 6:
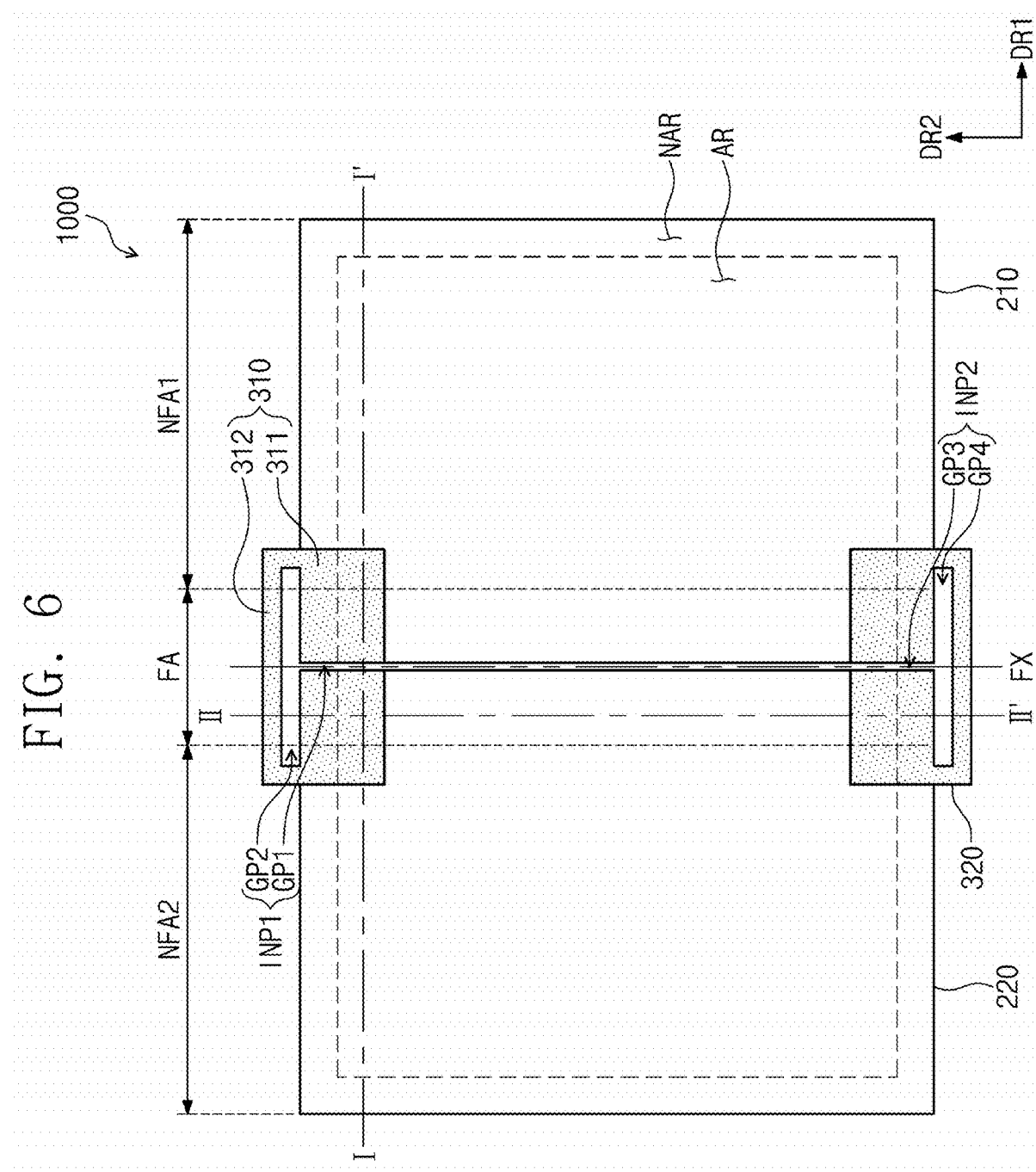
FIG. 6 is a plan view illustrating a rear surface of a display apparatus according to an embodiment of the invention.
Figure 7:
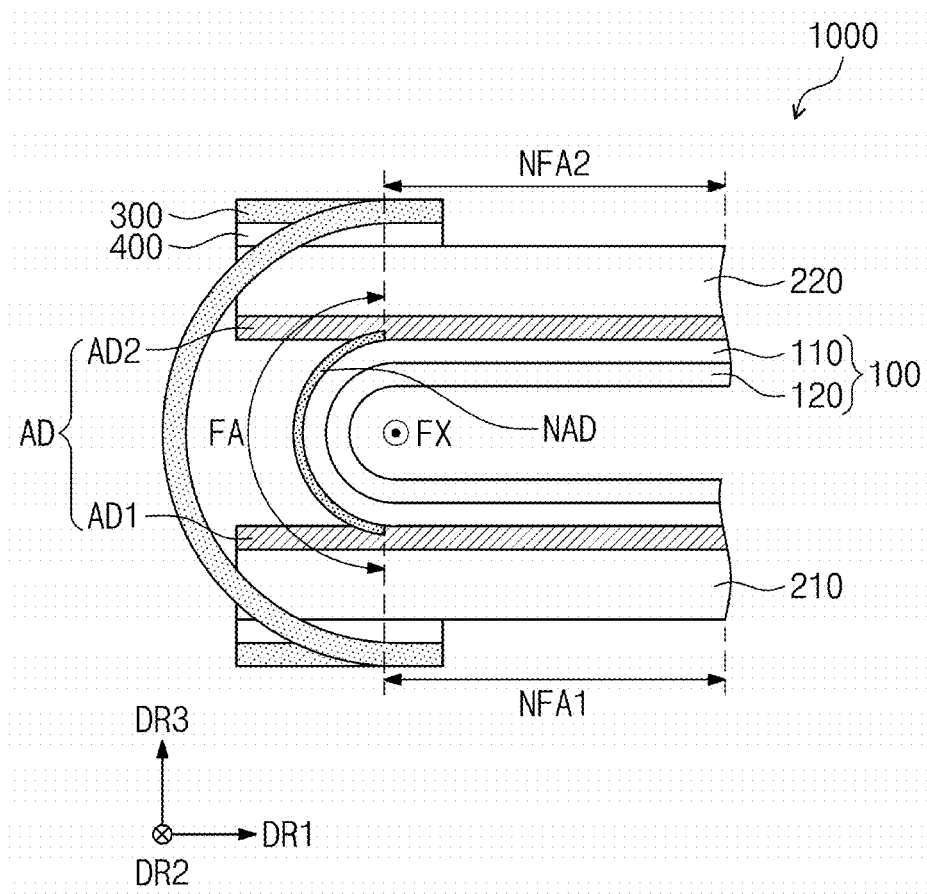
FIG. 7 is a sectional view illustrating a display apparatus in an in-folding state.
Figure 8:
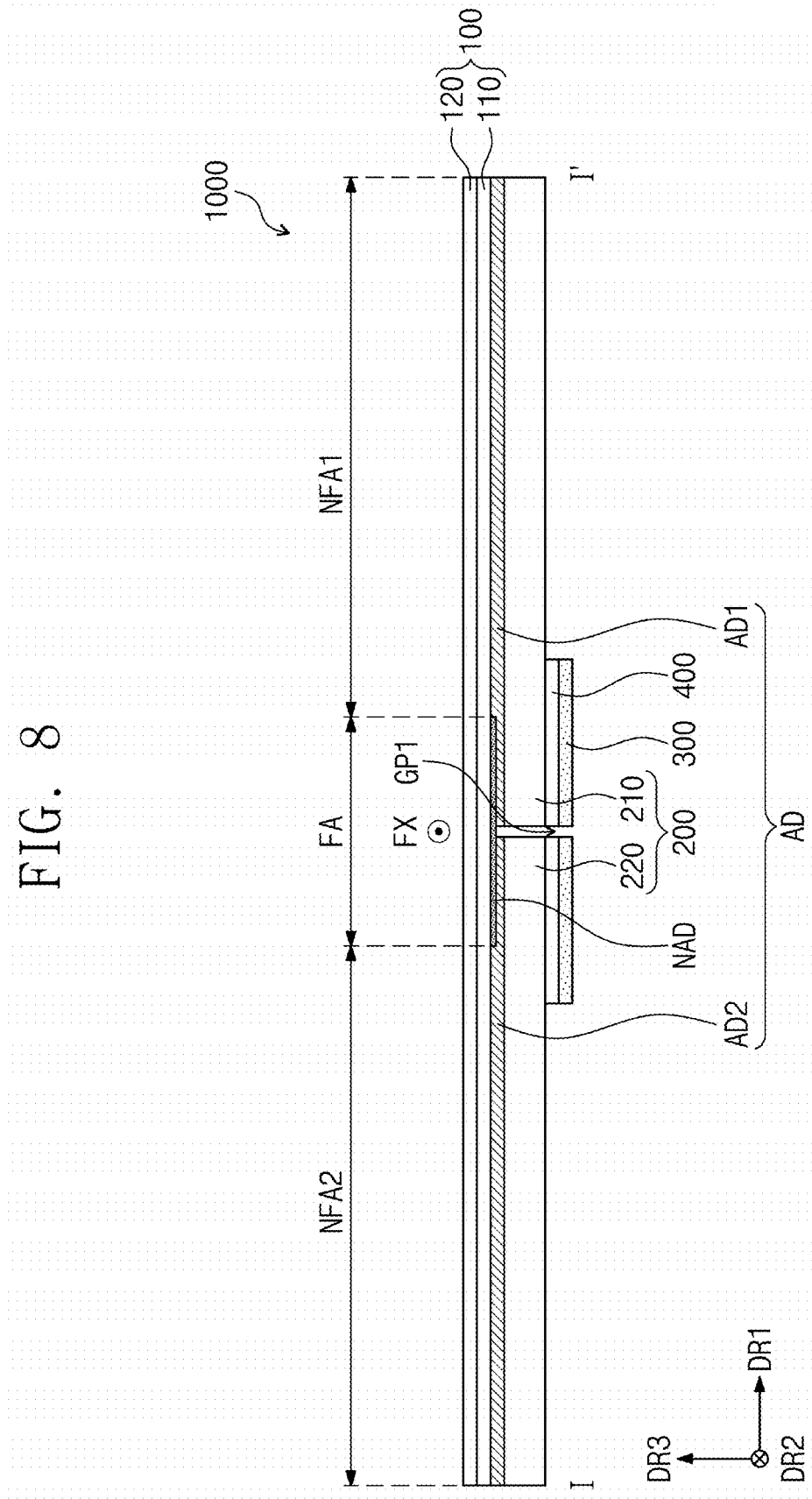
FIG. 8 is a sectional view taken along line I-I' of FIG. 6.
Figure 9:
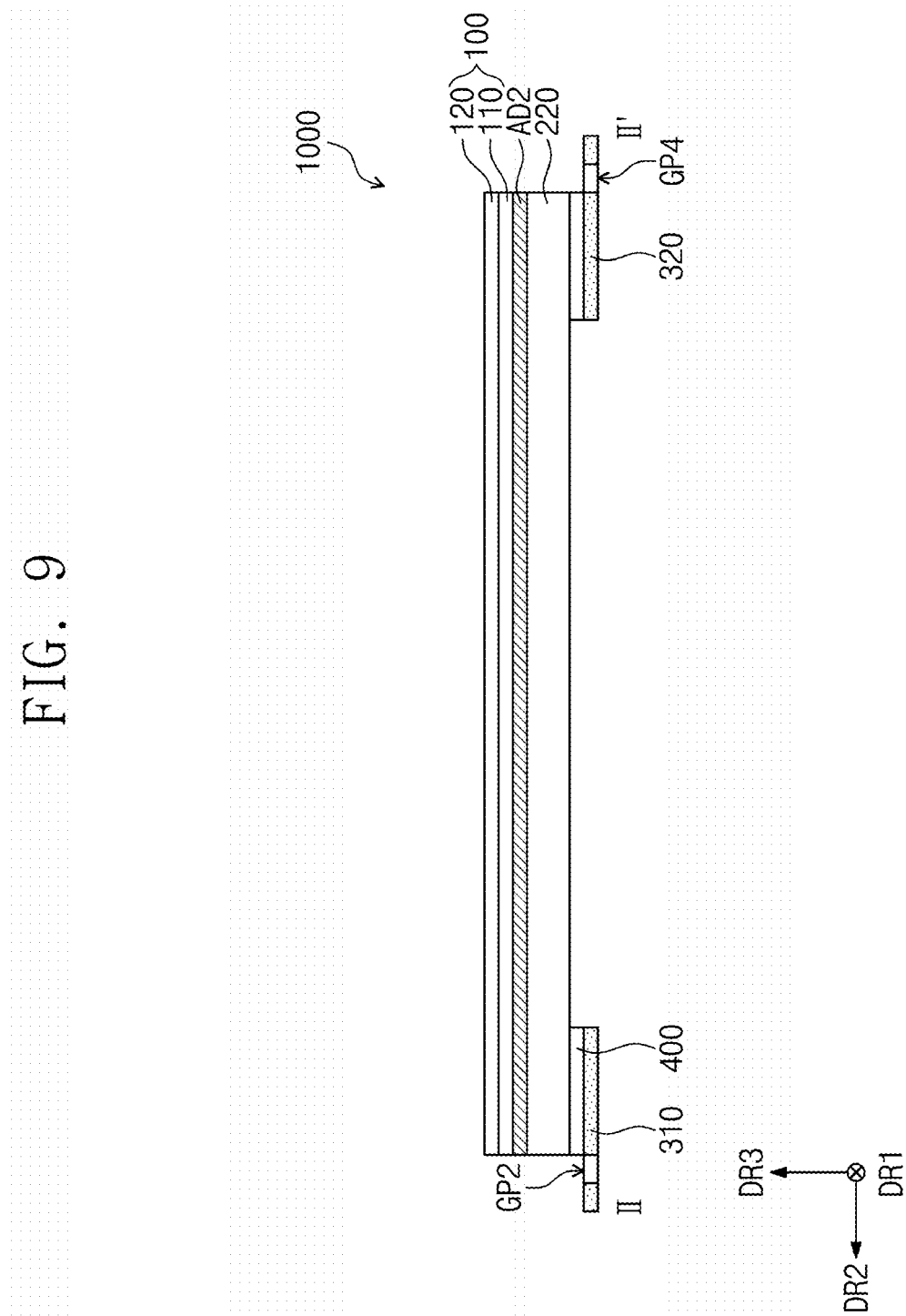
FIG. 9 is a sectional view taken along line II-II' of FIG. 6.

FIG. 6 is a plan view illustrating a rear surface of a display apparatus according to an embodiment of the invention, FIG. 7 is a sectional view illustrating a display apparatus in an inwardly folded (or in-folding) state, FIG. 8 is a sectional view taken along line I-I' of FIG. 6, and FIG. 9 is a sectional view taken along line II-II' of FIG. 6.

Referring to FIGS. 6 to 9, the non-adhesive member NAD may be disposed between the display module 100 and the adhesive member AD, as described above.

In an embodiment, the non-adhesive member NAD may be provided as a single object or formed as single unitary and indivisible unit. The non-adhesive member NAD may be adhered or attached to the bottom surface of the display module 100. A bottom surface of the display panel 110 may be a surface, which is one of two opposite surfaces of the display panel 110 and is spaced apart from the input sensing member 120.

In an embodiment, the non-adhesive member NAD may be an element that is coated on the bottom surface of the display module 100. However, the invention is not limited to a specific shape of the non-adhesive member NAD. In one embodiment, for example, the non-adhesive member NAD may be provided in a form of a film or sheet and then may be attached to the bottom surface of the display module 100.

The non-adhesive member NAD may overlap the folding region FA. The non-adhesive member NAD may not overlap the first non-folding region NFA1 and the second non-folding region NFA2.

The non-adhesive member NAD may include fluorine or titanium. In one embodiment, for example, the non-adhesive member NAD may be a coating layer that is formed by an anti-fingerprint coating. The non-adhesive member NAD may have a thickness of about 1 micrometer (μm) or less.

An adhesion strength between the adhesive member AD and the non-adhesive member NAD in the folding region FA may be weaker than an adhesion strength between the adhesive member AD and the display module 100 in the non-folding regions NFA1 and NFA2.

The non-adhesive member NAD may reduce the adhesion strength between the adhesive member AD and the display module 100. Thus, the adhesive member AD and the display module 100 may not be coupled to each other, in the folding region FA provided with the non-adhesive member NAD.

The bottom surface of the display module 100 overlapping the first non-folding region NFA1 may be coupled to the first adhesive member AD1, and the bottom surface of the display module 100 overlapping the second non-folding region NFA2 may be coupled to the second adhesive member AD2.

In an embodiment, a portion of the bottom surface of the display module 100 overlapping the folding region FA may be spaced apart from the supporting members 210 and 220 by the non-adhesive member NAD, when the display module 100 is folded.

In an embodiment, when the display module 100 is folded, the first and second supporting portions 210 and 220 having a relatively high rigidity may not be folded, such that a stress to be exerted on the folding region FA of the display module 100 may be decreased.

In general, if the display apparatus is repeatedly folded and unfolded, the display module 100 overlapping the folding region FA may be affected by a stress from the repeated folding and unfolding, such that a portion of the display module 100 corresponding to the folding region FA may be deformed.

In an embodiment of the display apparatus 1000 according to the invention, the display module 100 and the supporting member 200 are not adhered or attached to each other in the folding region FA, a stress to be applied to the display module 100 may be reduced during the folding operation of the display apparatus 1000. Thus, in such an embodiment of the invention, the display module 100 may be effectively prevented from being deformed and the display quality of the display apparatus 1000 may not be deteriorated.

In an embodiment, the reinforcing member 300 may be adhered to the supporting member 200. The adhesive reinforcing layer 400 may be disposed between the reinforcing member 300 and the supporting member 200.

The reinforcing member 300 may not hinder the first supporting portion 210 and the second supporting portion 220 from moving when the display apparatus 1000 is folded and may effectively prevent the first supporting portion 210 and the second supporting portion 220 from being damaged by the shear stress, which may occur when the first supporting portion 210 and the second supporting portion 220 are spaced apart from each other.

The reinforcing member 300 may include a synthetic resin or a metallic material, for example. The invention is not limited to a specific material for the reinforcing member 300, as long as the material has a modulus of about 1 gigapascal (GPa) or higher.

The reinforcing member 300 may include a first reinforcing member 310 and a second reinforcing member 320.

The first reinforcing member 310 may be connected to a side of the first supporting portion 210 and a side of the second supporting portion 220, which extend parallel to the first direction DR1.

The first reinforcing member 310 may have a first incision pattern INP1. The first incision pattern INP1 may be formed by removing a portion of a material constituting the first reinforcing member 310.

The first incision pattern INP1 may include a first sub-incision pattern GP1 and a second sub-incision pattern GP2.

The first sub-incision pattern GP1 may be provided to extend in the second direction DR2 and to overlap the folding axis FX. In an embodiment, the first sub-incision pattern GP1 may have a shape extending in the second direction DR2. In such an embodiment, the first sub-incision pattern GP1 may allow the first supporting portion 210 and the second supporting portion 220 to be spaced apart from the display module 100 in the folding region FA, when the display apparatus 1000 is folded.

The second sub-incision pattern GP2 may be connected to the first sub-incision pattern GP1 and may extend in the first direction DR1. The second sub-incision pattern GP2 may have a length greater than the folding region FA, in the first direction DR1.

The second sub-incision pattern GP2 may not overlap the first supporting portion 210 and the second supporting portion 220. In an embodiment, at least a portion of the second sub-incision pattern GP2 may overlap the first supporting portion 210 and the second supporting portion 220.

The first reinforcing member 310 may include an inner reinforcing member 311, which is disposed inside the second sub-incision pattern GP2 in the second direction DR2, and an outer reinforcing member 312, which is disposed outside the second sub-incision pattern GP2 in the second direction DR2.

The inner reinforcing member 311 may be adhered or attached to the first supporting portion 210 and the second supporting portion 220, and thus, the inner reinforcing member 311 may be allowed to move along with the first supporting portion 210 and the second supporting portion 220, when the display apparatus 1000 is folded.

The outer reinforcing member 312 may connect the first supporting portion 210 and the second supporting portion 220 to each other and may effectively prevent the first supporting portion 210 and the second supporting portion 220 from moving in the second direction DR2 by an external impact.

The outer reinforcing member 312 may not overlap the first supporting portion 210 and the second supporting portion 220. Thus, the outer reinforcing member 312 may not interfere with a path of the first supporting portion 210 and the second supporting portion 220 being spaced apart from the display module 100 in the folding region FA, when the display apparatus 1000 is folded.

The second reinforcing member 320 may be connected to an opposite side of the first supporting portion 210 and an opposite side of the second supporting portion 220, which are extended parallel to the first direction DR1. The second reinforcing member 320 may be spaced apart from the first reinforcing member 310 in the second direction DR2.

The second reinforcing member 320 may include a second incision pattern INP2. The second incision pattern INP2 may include a third sub-incision pattern GP3 and a fourth sub-incision pattern GP4. The third sub-incision pattern GP3 may have a substantially same shape as the first sub-incision pattern GP1. The fourth sub-incision pattern GP4 may have a substantially same shape as the second sub-incision pattern GP2.

Figure 10:
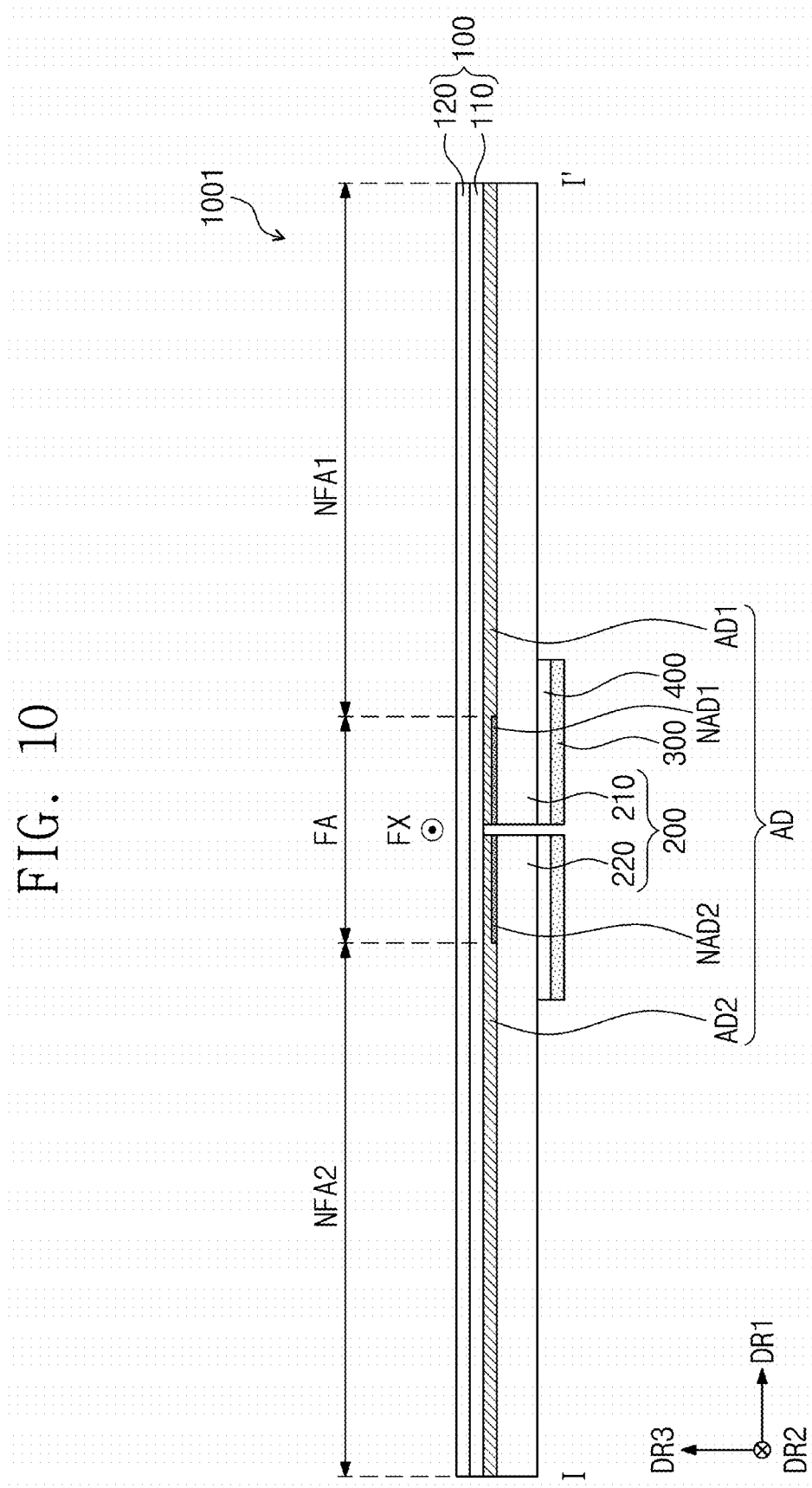
FIGS. 10 and 11 are sectional views illustrating display apparatuses according to alternative embodiments of the invention, taken along line I-I' of FIG. 6.
Figure 11:
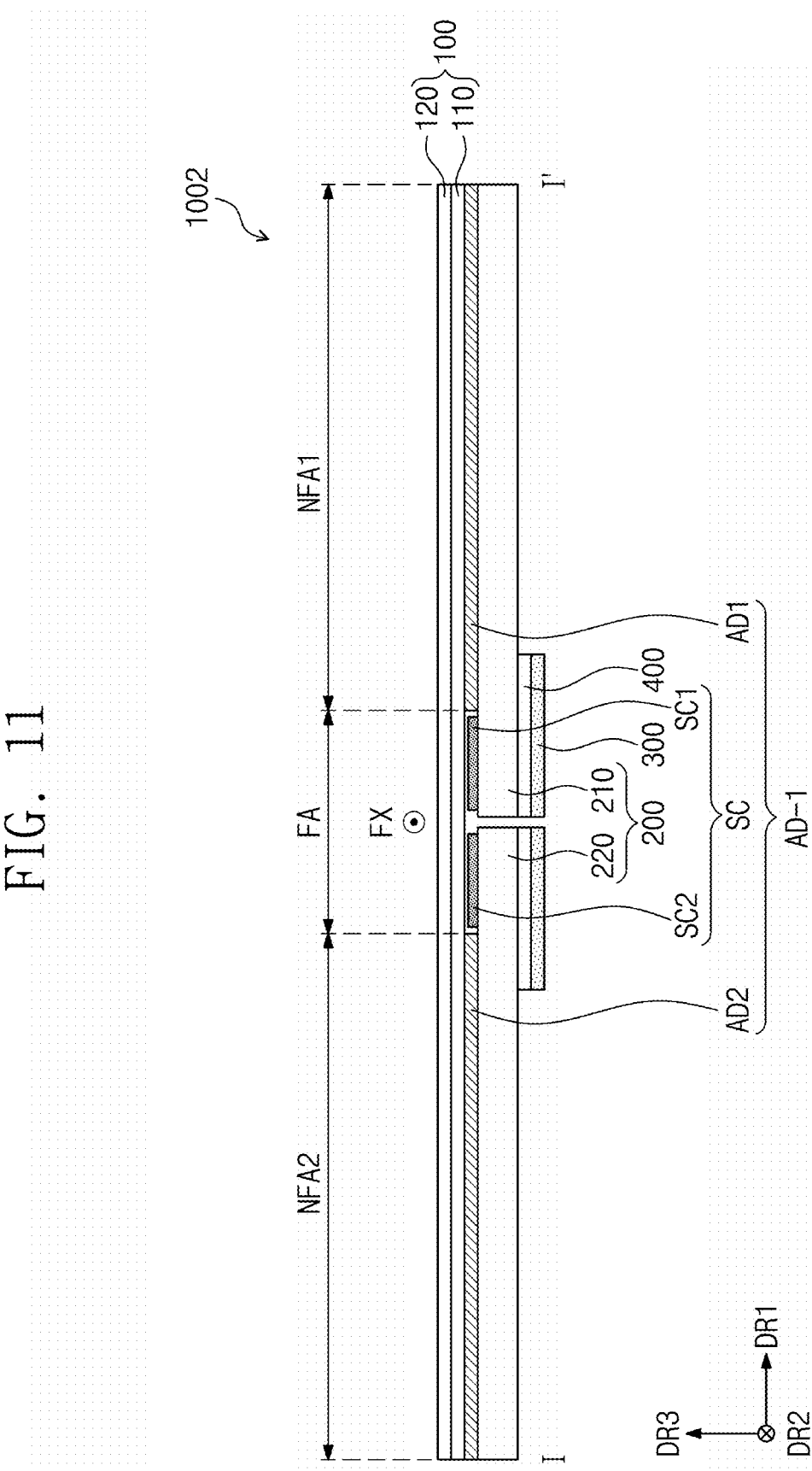

FIGS. 10 and 11 are sectional views illustrating display apparatuses according to alternative embodiments of the invention, taken along line I-I' of FIG. 6.

For concise description, the same or like element as a previously described element may be identified by a similar or identical reference number without any repetitive detailed description thereof. Elements that are not repetitively described may be configured to have substantially the same technical features as those in the previously described embodiments.

Referring to FIG. 10, an embodiment of a display apparatus 1001 may include a first non-adhesive member NAD1 and a second non-adhesive member NAD2.

The first non-adhesive member NAD1 and the second non-adhesive member NAD2 may be disposed between the adhesive member AD and the supporting member 200.

The first non-adhesive member NAD1 may be disposed between the first supporting portion 210 and the adhesive member AD, and the second non-adhesive member NAD2 may be disposed between the second supporting portion 220 and the adhesive member AD.

The first non-adhesive member NAD1 may be coupled to a top surface of the first supporting portion 210, and the second non-adhesive member NAD2 may be coupled to a top surface of the second supporting portion 220.

The first and second non-adhesive members NAD1 and NAD2 may overlap the folding region FA. The first and second non-adhesive members NAD1 and NAD2 may be spaced apart from each other.

In such an embodiment, the first non-adhesive member NAD1 allows the first supporting portion 210 and the adhesive member AD not to be coupled to each other in the folding region FA. In such an embodiment, the second non-adhesive member NAD2 allows the second supporting portion 220 and the adhesive member AD not be coupled to each other in the folding region FA.

Thus, in such an embodiment, when the display module 100 is folded, the first and second supporting portions 210 and 220 with a relatively high rigidity may not be folded, such that a stress to be exerted on the folding region FA of the display module 100 may be decreased.

Referring to FIG. 11, an embodiment of a display apparatus 1002 may not include the non-adhesive member NAD but may further include a height-difference compensation layer SC.

The display apparatus 1002 may include an adhesive member AD-1 that is disposed on the non-folding regions NFA1 and NFA2 and is not disposed on the folding region FA. In such an embodiment, the supporting member 200 and the display module 100 are not adhered to each other in the folding region FA by the height-difference compensation layer SC, such that the supporting member 200 may not be folded, even when the display module 100 is folded.

If, an empty space is provided between the display module 100 and the supporting member 200 in the folding region FA, a stain in the folding region FA may be recognized or visible.

In an embodiment, the height-difference compensation layer SC may be disposed in the empty space between the display module 100 and the supporting member 200 and may effectively reduce a difference in height between the display module 100 and the supporting member 200. In such an embodiment, the height-difference compensation layer SC may allow the stain in the folding region FA to be prevented from being recognized or visible, and thus, the display quality of the display apparatus 1002 may be improved.

The height-difference compensation layer SC may include a first height-difference compensation layer SC1 and a second height-difference compensation layer SC2. The first height-difference compensation layer SC1 and the second height-difference compensation layer SC2 may be spaced apart from each other.

The first height-difference compensation layer SC1 may be disposed between the first supporting portion 210 and the display module 100, and the second height-difference compensation layer SC2 may be disposed between the second supporting portion 220 and the display module 100.

FIG. 11 illustrates an exemplary embodiment, in which the height-difference compensation layer SC is coupled to the top surface of the supporting member 200, but the invention is not limited thereto. In one alternative embodiment, for example, the height-difference compensation layer SC may be coupled to the bottom surface of the display module 100.

Figure 12:
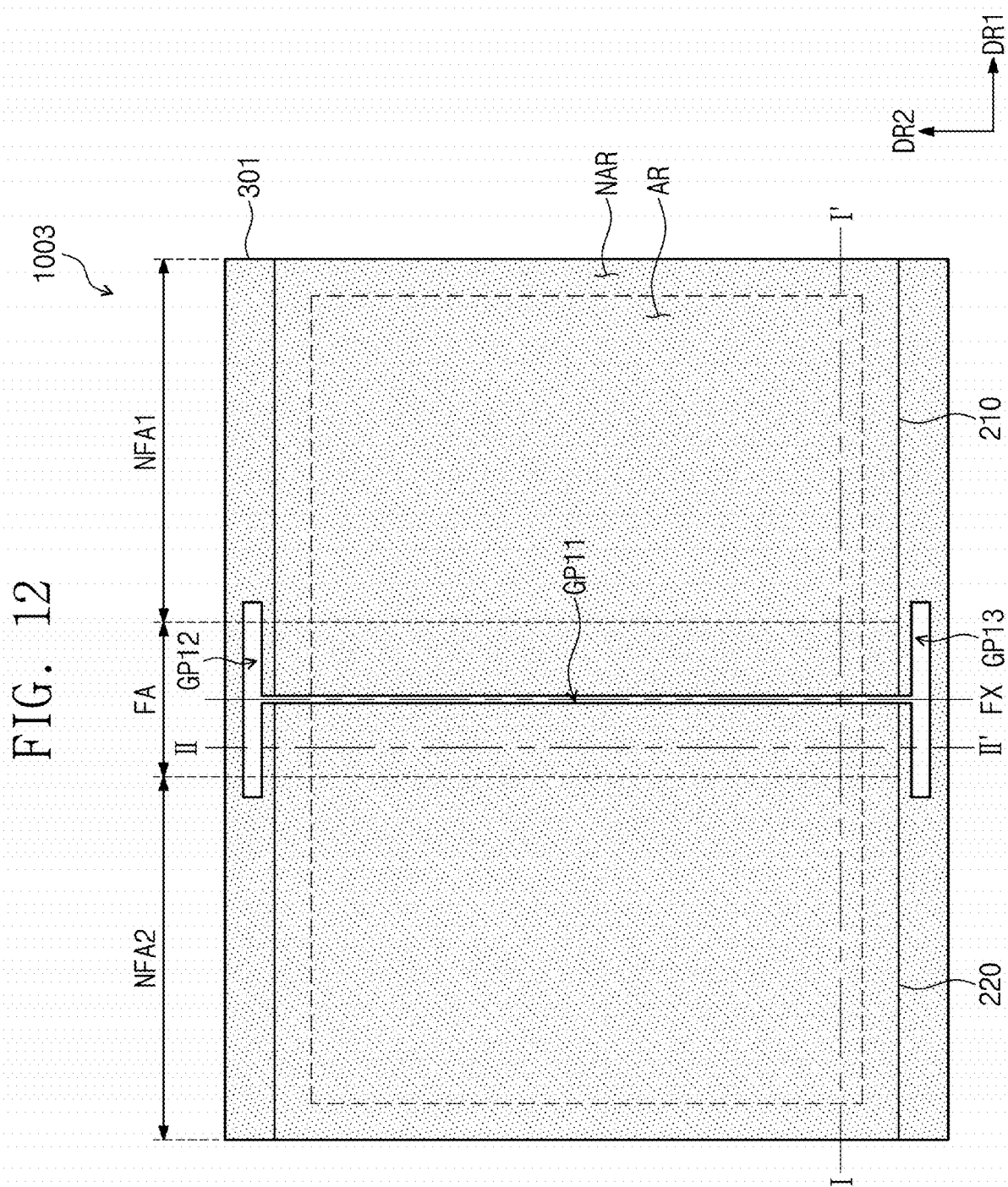
FIG. 12 is a plan view illustrating a rear surface of a display apparatus according to another alternative embodiment of the invention.
Figure 13:
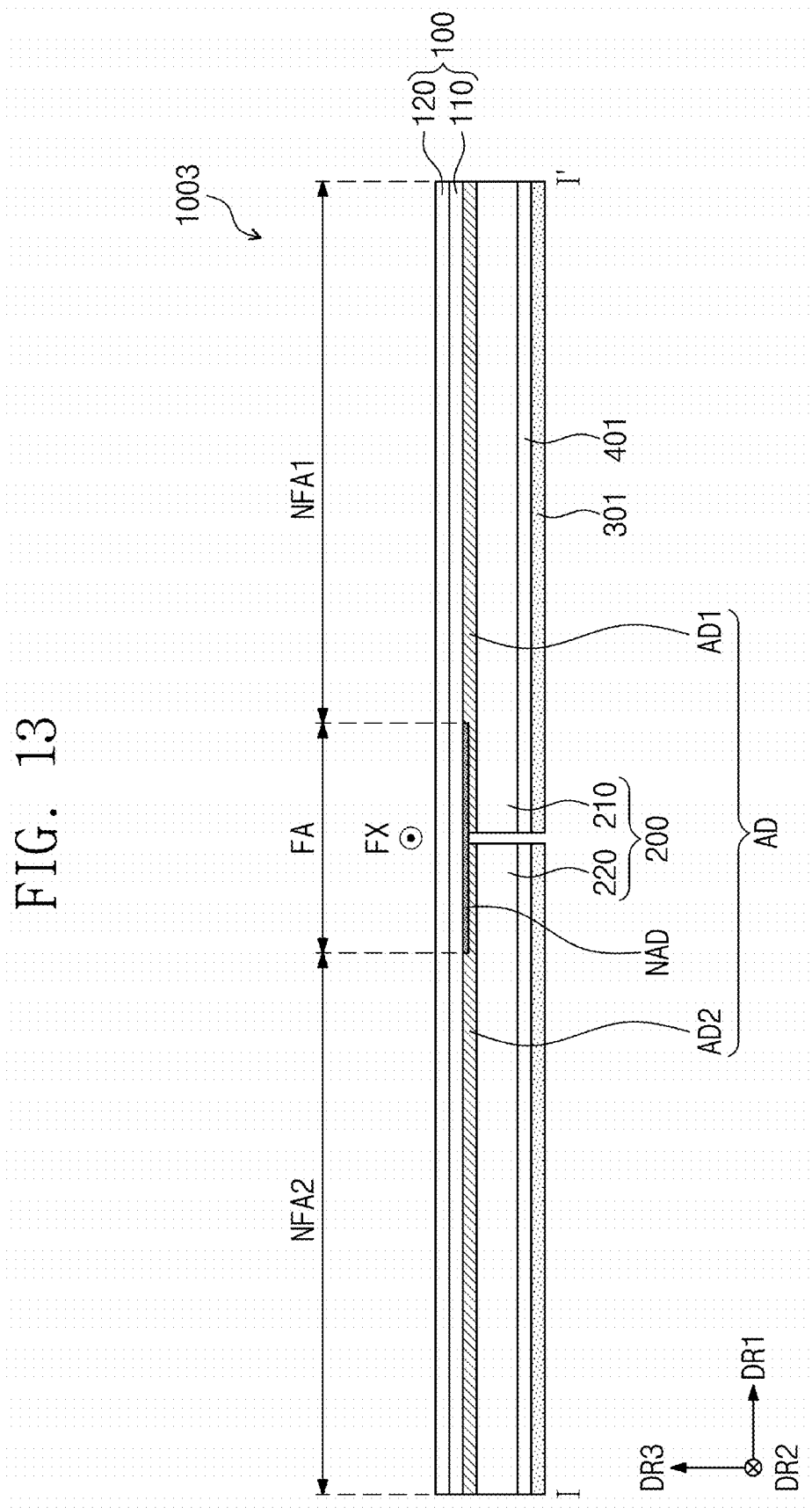
FIG. 13 is a sectional view taken along line I-I' of FIG. 12.
Figure 14:
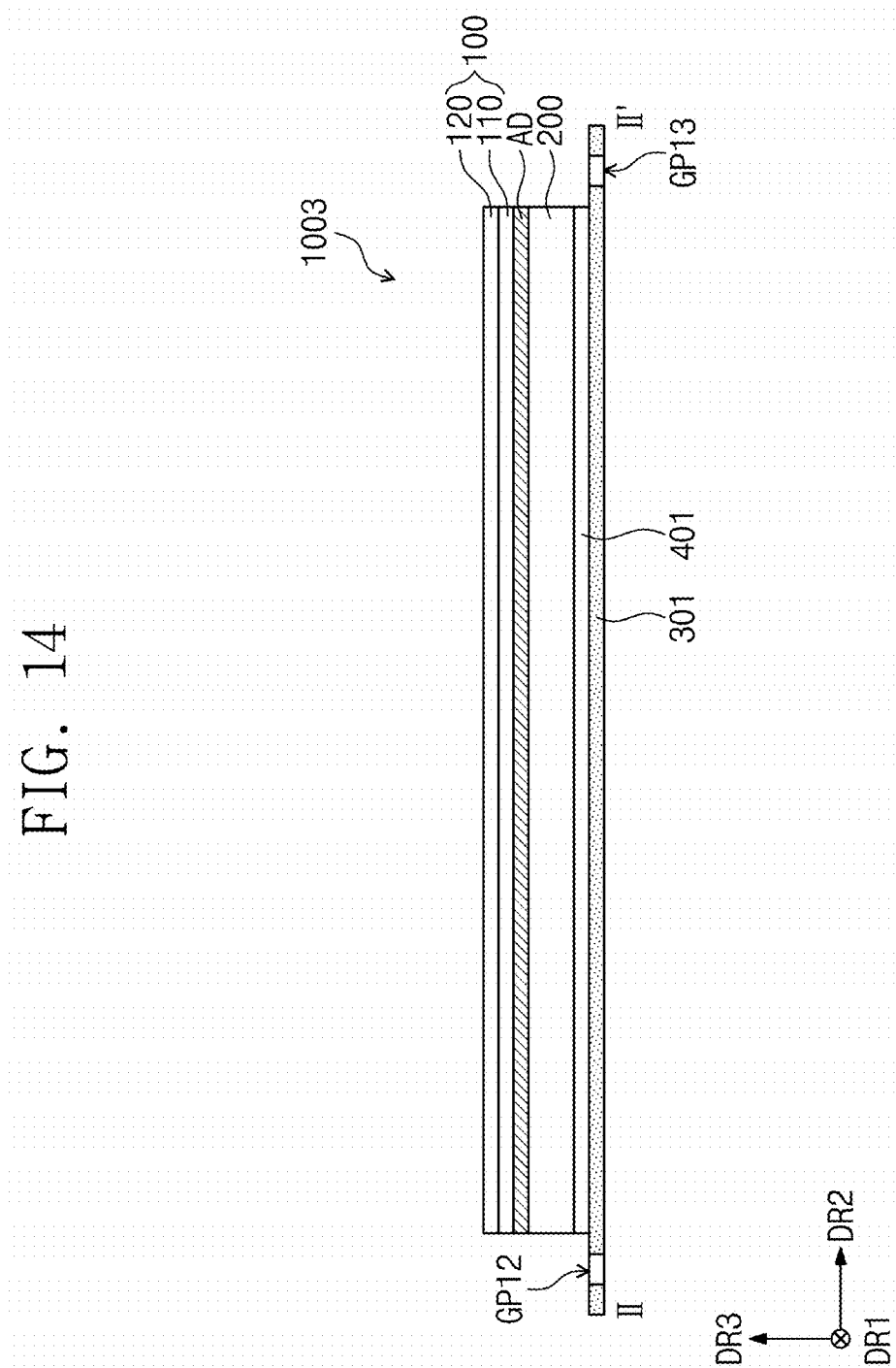
FIG. 14 is a sectional view taken along line II-II' of FIG. 12.

FIG. 12 is a plan view illustrating a rear surface of a display apparatus according to another alternative embodiment of the invention, FIG. 13 is a sectional view taken along line I-I' of FIG. 12, and FIG. 14 is a sectional view taken along line II-II' of FIG. 12.

For concise description, the same or like element as a previously described element may be identified by a similar or identical reference number without any repetitive detailed description thereof. Elements that are not repetitively described may be configured to have substantially the same technical features as those in the previously described embodiments.

As shown in FIGS. 12 to 14, an embodiment of a display apparatus 1003 may include a reinforcing member 301. The reinforcing member 301 may be provided as a single object or formed as single unitary and indivisible unit.

The reinforcing member 301 may be adhered or attached to a bottom surface of the supporting member 200 by an adhesive reinforcing layer 401.

The reinforcing member 301 may include first to third sub-incision patterns GP11, GP12 and GP13.

The first sub-incision pattern GP11 may be provided to extend in the second direction DR2 and to overlap with the folding axis FX. The first sub-incision pattern GP11 may have a shape connecting the first sub-incision pattern GP1 of the first reinforcing member 310 and the third sub-incision pattern GP3 of the second reinforcing member 320, which are described above with reference to FIG. 6, to each other.

The second sub-incision pattern GP12 may be connected to an end of the first sub-incision pattern GP11 and may extend in the first direction DR1. The second sub-incision pattern GP12 may have a length larger than the folding region FA, in the first direction DR1. The second sub-incision pattern GP12 may have substantially the same shape as the second sub-incision pattern GP2 of the first reinforcing member 310 described above with reference to FIG. 6.

The third sub-incision pattern GP13 may be connected to an opposite end of the first sub-incision pattern GP11 and may extend in the first direction DR1. The third sub-incision pattern GP13 may have a length larger than the folding region FA, in the first direction DR1. The third sub-incision pattern GP13 may have substantially the same shape as the fourth sub-incision pattern GP4 of the second reinforcing member 320 described above with reference to FIG. 6.

Figure 15:
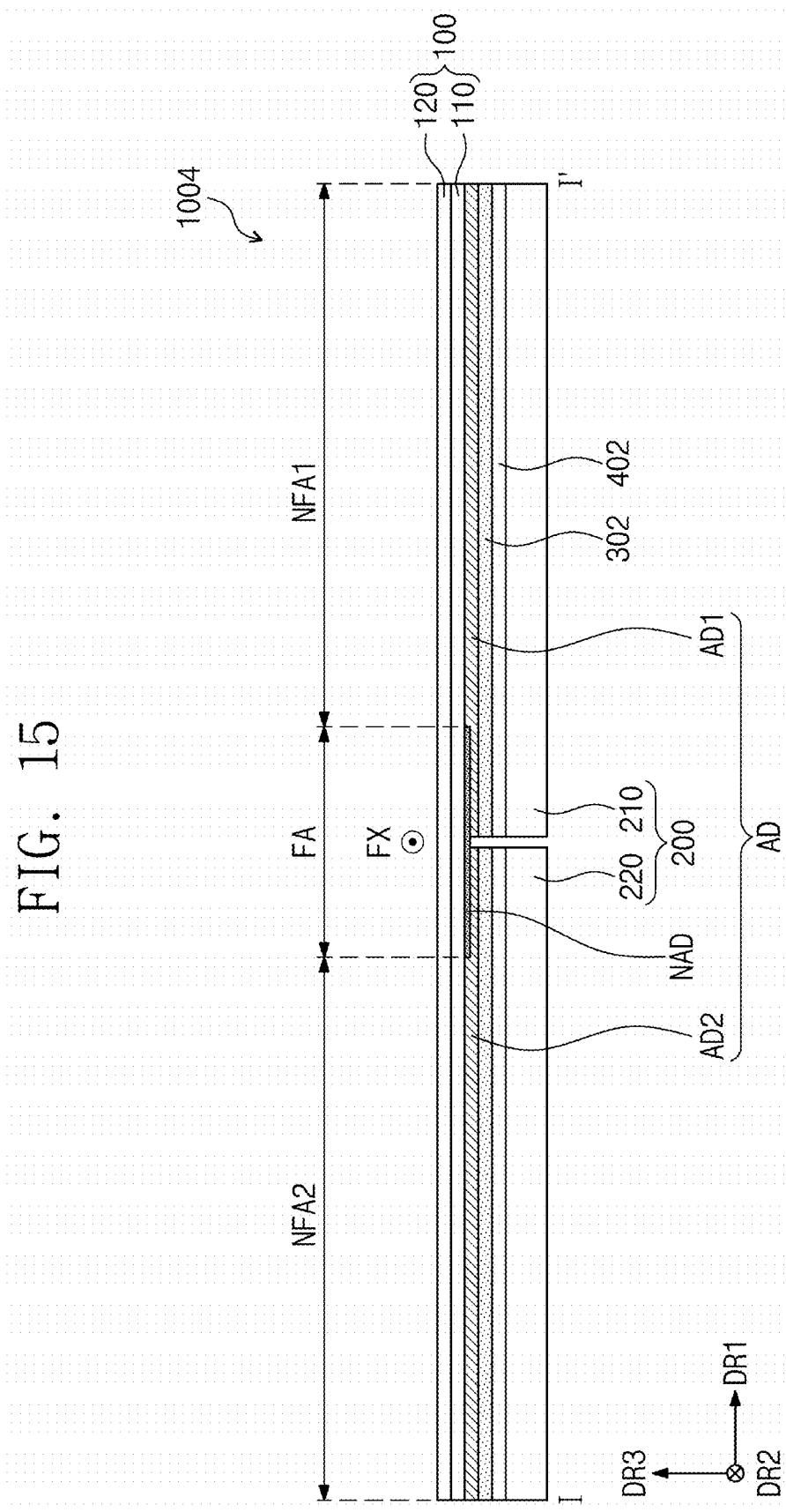
FIG. 15 is a sectional view illustrating a display apparatus according to another alternative embodiment of the invention.
Figure 16:
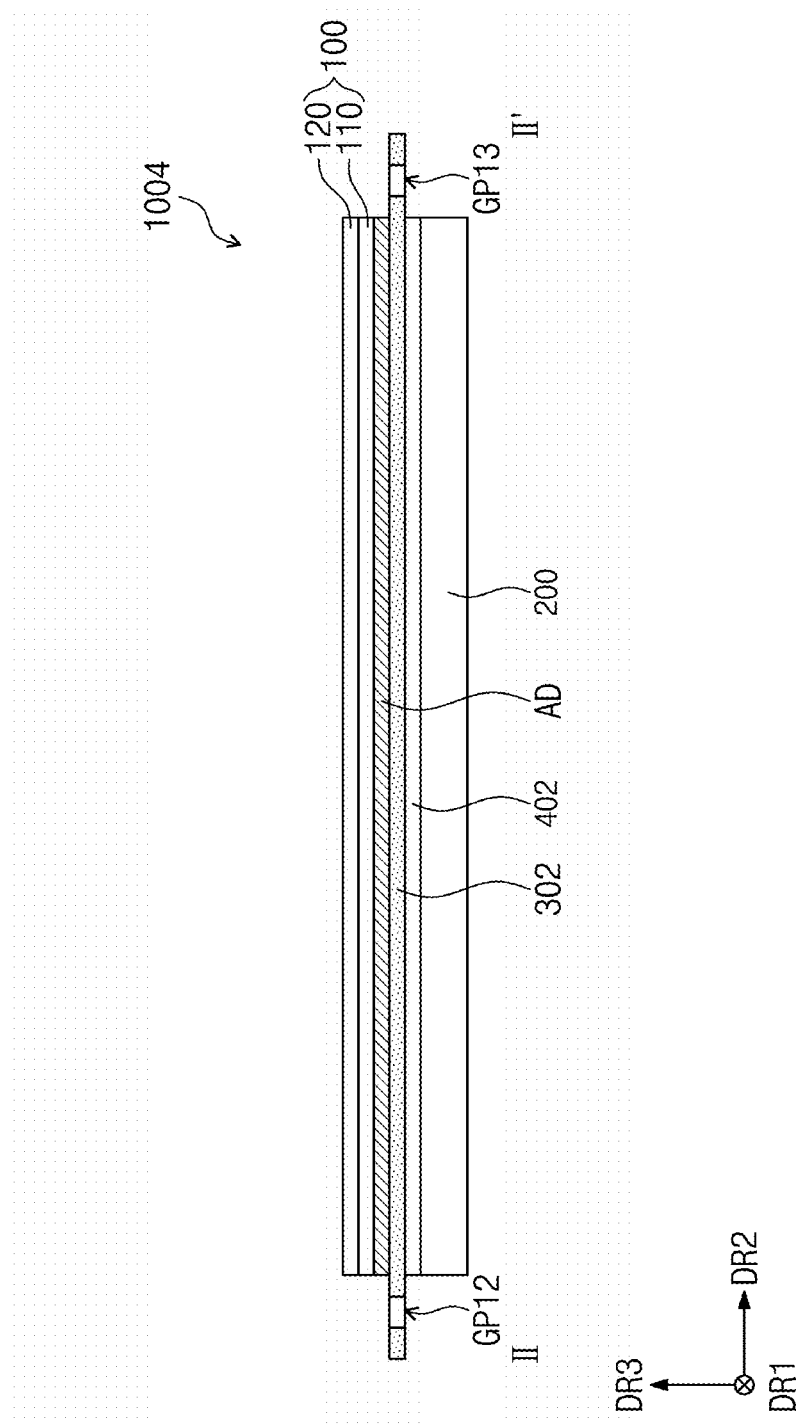
FIG. 16 is a sectional view illustrating a display apparatus according to another alternative embodiment of the invention.

FIGS. 15 and 16 are sectional views illustrating a display apparatus according to another alternative embodiment of the invention. In particular, FIG. 15 is a sectional view corresponding to the sectional view of FIG. 13, and FIG. 16 is a sectional view corresponding to the sectional view of FIG. 14

In an embodiment, as shown in FIGS. 15 and 16, a reinforcing member 302 of a display apparatus 1004 may be different from the reinforcing member 301 of the display apparatus 1003 described above with reference to FIGS. 12 to 14, e.g., positions thereof.

The reinforcing member 302 may be adhered to a top surface of the supporting member 200 by an adhesive reinforcing layer 402.

The reinforcing member 302 may have substantially the same planar shape as the reinforcing member 301 described above with reference to FIG. 12.

Figure 17:
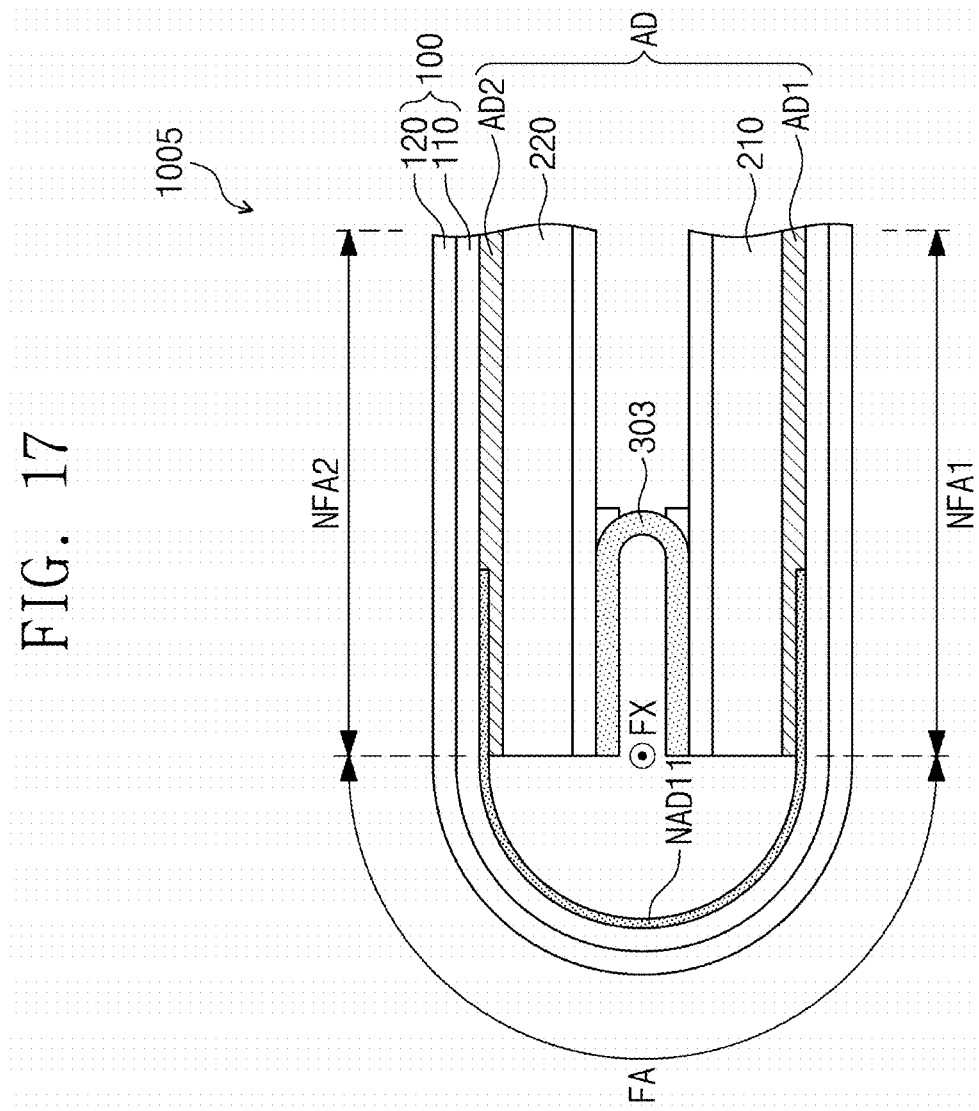
FIG. 17 is a sectional view illustrating an outwardly folded structure of a display apparatus according to another alternative embodiment of the invention.

FIG. 17 is a sectional view illustrating an outwardly folded (or out-folding) structure of a display apparatus according to another alternative embodiment of the invention.

Referring to FIG. 17, an embodiment of a display apparatus 1005 may be folded in the out-folding manner. The display apparatus 1005 of FIG. 17 may have substantially the same structure as the display apparatus 1000 described above with reference to FIGS. 1 to 9, except for the folding direction.

In such an embodiment, when the display apparatus 1005 is in the out-folding state, a non-adhesive member NAD11 may overlap not only the folding region FA but also a portion of the first and second non-folding regions NFA1 and NFA2 adjacent to the folding region FA.

However, the invention is not limited thereto, and the shapes of the non-adhesive member NAD11 and the adhesive member AD may be variously modified and some elements may be selectively omitted.

In an embodiment, a reinforcing member 303 may be coupled to the first supporting portion 210 and the second supporting portion 220.

According to embodiments of the invention, as set forth herein, durability and display quality of a display apparatus may be improved.

The invention should not be construed as being limited to the exemplary embodiments set forth herein. Rather, these exemplary embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A display apparatus, comprising:
a display module which displays an image, wherein a folding region, a first non-folding region and a second non-folding region are defined in the display module when viewed in a plan view, the folding region is foldable about an imaginary folding axis, and the first and second non-folding regions are adjacent to two opposite sides of the folding region, respectively;
a first supporting portion which supports the first non-folding region;
a second supporting portion which supports the second non-folding region and is spaced apart from the first supporting portion; and
a reinforcing member adhered to the first and second supporting portions, wherein an incision pattern, which overlaps the folding axis in the folding region, is defined in the reinforcing member,
wherein the incision pattern defines a portion removed from the reinforcing member in the plan view relative to a remaining portion defining the reinforcing member in the plan view.

2. The display apparatus of claim 1, wherein
when the display module is in an unfolded state, the folding region is disposed between the first non-folding region and the second non-folding region in a first direction, and the folding axis is extended in a second direction crossing the first direction,
the incision pattern comprises a first sub-incision pattern and a second sub-incision pattern,
the first sub-incision pattern extends in the second direction and overlaps the folding axis, and
the second sub-incision pattern is connected to the first sub-incision pattern and extends in the first direction.

3. The display apparatus of claim 2, wherein the second sub-incision pattern has a length greater than a length of the folding region in the first direction.

4. The display apparatus of claim 2, wherein the second sub-incision pattern does not overlap the first and second supporting portions or at least a portion of the second sub-incision pattern overlaps the first and second supporting portions.

5. The display apparatus of claim 2, wherein the reinforcing member comprises:
an inner reinforcing member disposed inside the second sub-incision pattern in the second direction; and
an outer reinforcing member disposed outside the second sub-incision pattern in the second direction, and the outer reinforcing member does not overlap the first and second supporting portions, when viewed in the plan view.

6. The display apparatus of claim 1, wherein the reinforcing member is coupled to a bottom surface of the first supporting portion and a bottom surface of the second supporting portion.

7. The display apparatus of claim 1, wherein the reinforcing member comprises:
   a first reinforcing member connected to a side of the first supporting portion and a side of the second supporting portion; and
   a second reinforcing member spaced apart from the first reinforcing member and connected to an opposite side of the first supporting portion and an opposite side of the second supporting portion.

8. The display apparatus of claim 1, wherein the reinforcing member is formed as single unitary and indivisible unit.

9. The display apparatus of claim 8, wherein
   when the display module is in an unfolded state, the folding region is disposed between the first non-folding region and the second non-folding region in a first direction, and the folding axis extends in a second direction crossing the first direction,
   the incision pattern comprises a first sub-incision pattern, a second sub-incision pattern and a third sub-incision pattern,
   the first sub-incision pattern extends in the second direction and overlaps the folding axis;
   the second sub-incision pattern is connected to an end of the first sub-incision pattern and is extended in the second direction; and
   the third sub-incision pattern is connected to an opposite end of the first sub-incision pattern and is extended in the second direction.

10. The display apparatus of claim 9, wherein each of the second sub-incision pattern and the third sub-incision pattern has a length greater than a length of the folding region in the first direction.

11. The display apparatus of claim 9, wherein each of the second and third sub-incision patterns does not overlap the first and second supporting portions, or at least a portion of each of the second and third sub-incision patterns overlaps the first and second supporting portions.

12. The display apparatus of claim 1, wherein the reinforcing member is coupled to a top surface of the first supporting portion and a top surface of the second supporting portion.

13. The display apparatus of claim 1, wherein each of the first and second supporting portions has a rigidity higher than a rigidity of the display module.

14. The display apparatus of claim 1, wherein the folding region of the display module is inwardly folded such that two portions of a display surface displaying the image face each other.

15. The display apparatus of claim 1, further comprising:
   an adhesive member disposed between the display module and the first supporting portion and between the display module and the second supporting portion; and
   a non-adhesive member disposed between the display module and the first supporting portion and between the display module and the second supporting portion in the folding region,
   the non-adhesive member is in contact with the adhesive member.

16. A display apparatus, comprising:
   a display module which displays an image, wherein a folding region, a first non-folding region and a second non-folding region are defined in the display module when viewed in a plan view, the folding region is foldable about an imaginary folding axis, and the first and second non-folding regions are adjacent to two opposite sides of the folding region in a first direction, respectively;
   a first supporting portion which supports the first non-folding region;
   a second supporting portion which supports the second non-folding region and is spaced apart from the first supporting portion; and
   a reinforcing member adhered to the first and second supporting portions, wherein the reinforcing member includes a sub-incision pattern, which has a width greater than a width of the folding region in the first direction,
   wherein the sub-incision pattern defines a portion removed from the reinforcing member in the plan view relative to a remaining portion defining the reinforcing member in the plan view.

17. The display apparatus of claim 16, wherein the sub-incision pattern does not overlap the first and second supporting portions or at least a portion of the sub-incision pattern overlaps the first and second supporting portions.

18. The display apparatus of claim 16, wherein
   the folding axis extends in a second direction crossing the first direction,
   the reinforcing member comprises an inner reinforcing member, which is disposed inside the sub-incision pattern in the second direction, and an outer reinforcing member, which is disposed outside the sub-incision pattern in the second direction, and
   the outer reinforcing member does not overlap the first and second supporting portions, when viewed in the plan view.

19. The display apparatus of claim 16, wherein the reinforcing member comprises a synthetic resin or a metallic material.

20. A display apparatus, comprising:
   a display module which displays an image, wherein a folding region, a first non-folding region and a second non-folding region are defined in the display module when viewed in a plan view, the folding region is foldable about an imaginary folding axis, and the first and second non-folding regions are adjacent to two opposite sides of the folding region in a first direction, respectively;
   a first supporting portion which supports the first non-folding region;
   a second supporting portion which supports the second non-folding region and is spaced apart from the first supporting portion;
   an adhesive member disposed between the display module and the first supporting portion and between the display module and the second supporting portion;
   a non-adhesive member disposed between the display module and the first supporting portion and between the display module and the second supporting portion in the folding region, wherein the non-adhesive member is in contact with the adhesive member; and
   a reinforcing member adhered to the first and second supporting portions, wherein the reinforcing member includes a first sub-incision pattern, which overlaps the folding axis in the folding region in a same direction as the folding axis, and a second sub-incision pattern, which is connected to an end of the first sub-incision pattern and has a width larger than a width of the folding region in the first direction.

\* \* \* \* \*